United States Patent [19]

Machida et al.

[11] Patent Number: 5,796,588
[45] Date of Patent: Aug. 18, 1998

[54] ELECTRICAL APPARATUS CONTAINING BATTERIES

[75] Inventors: Toyoji Machida; Mitsuya Hara, both of Tsuna-gun, Japan

[73] Assignee: Sanyo Electric Co., Ltd., Osaka, Japan

[21] Appl. No.: 515,198

[22] Filed: Aug. 15, 1995

[30] Foreign Application Priority Data

Sep. 29, 1994 [JP] Japan .................... 6-234835

[51] Int. Cl.$^6$ .................... H01M 2/20; H01M 2/26
[52] U.S. Cl. .................... 361/773; 361/774; 439/82; 439/83; 439/500; 429/96; 429/100; 429/121
[58] Field of Search .................... 361/760, 773, 361/774, 807; 439/80–83, 500; 429/96, 98, 100, 121

[56] References Cited

U.S. PATENT DOCUMENTS

| Re. 34,084 | 9/1992 | Noschese | 439/82 |
| 3,452,149 | 6/1969 | Rinaldi | 439/83 |
| 4,076,356 | 2/1978 | Tamburro | 439/82 |
| 4,687,269 | 8/1987 | Dubertret et al. | 439/82 |
| 4,691,979 | 9/1987 | Manska | 439/82 |
| 4,776,807 | 10/1988 | Triner et al. | 439/82 |
| 4,795,378 | 1/1989 | Tomizu et al. | 439/82 |
| 4,802,862 | 2/1989 | Seidler | 439/83 |
| 4,878,861 | 11/1989 | Kendall et al. | 439/82 |
| 4,936,797 | 6/1990 | Wehrle et al. | 439/82 |
| 5,505,629 | 4/1996 | Majima et al. | 439/500 |
| 5,509,814 | 4/1996 | Mosquera | 439/82 |

FOREIGN PATENT DOCUMENTS

| 59-173972 | 11/1984 | Japan . |
| 61-138457 | 6/1986 | Japan . |
| 63-155262 | 10/1988 | Japan . |
| 4-106846 | 9/1992 | Japan . |

*Primary Examiner*—Leo P. Picard
*Assistant Examiner*—John B. Vigushin
*Attorney, Agent, or Firm*—Wenderoth, Lind & Ponack

[57] ABSTRACT

An electrical apparatus houses batteries mounted on a printed circuit board (PCB) via conducting tabs with cylindrical insertion sections. The cylindrical insertion sections fit into circular holes in the PCB or into cylindrical sockets soldered into PCB holes. Battery attachment can either be permanent by soldering tabs into the holes or removable by tab insertion into sockets. Removable attachment allows easy battery recovery for recycling. Utilizing the elasticity of sheet metal and cylindrical shaped tabs provides more secure battery attachment resulting in good shock and vibration resistance, and contact over a cylindrical surface insures good electrical connection.

16 Claims, 9 Drawing Sheets

FIG. 1

PRIOR ART

FIG. 2

PRIOR ART

FIG. 3

PRIOR ART

FIG. 4

PRIOR ART

FIG. 5

PRIOR ART

FIG. 6

PRIOR ART

ELECTRICAL APPARATUS CONTAINING BATTERIES

BACKGROUND OF THE INVENTION

This invention relates to an electrical apparatus wherein the case can be opened and the batteries can be removed for separate disposal treatment when the apparatus is discarded, or wherein good electrical connection between the batteries and a printed circuit board (PCB) can be assured.

Small electrical apparatus such as an electric shaver can be conveniently used as a cordless unit when powered with dry cell or other batteries. Electrical apparatus powered by non-rechargeable dry cell batteries have a removable battery configuration to allow replacement of exhausted batteries. On the other hand, electrical apparatus powered by rechargeable batteries can be used repeatedly by recharging, hence there is no need to exchange batteries and the batteries can be fixed to a PCB within the electrical apparatus. A configuration with batteries fixed to a PCB has the characteristic that poor battery contact problems are virtually eliminated. When batteries become completely discharged in this type of electrical apparatus, they can be charged with an internal charging circuit or by connecting an external battery charger. In this manner, the batteries can be fully charged and the electrical apparatus can be used repeatedly. Since the batteries can be used repeatedly, there is no need to remove or replace batteries and they can be fixed within the apparatus. Therefore, an electrical apparatus containing rechargeable batteries has the characteristic that there is no requirement to house the batteries in a removable fashion as for non-rechargeable batteries and the battery attachment system can be simplified.

Figure 1:
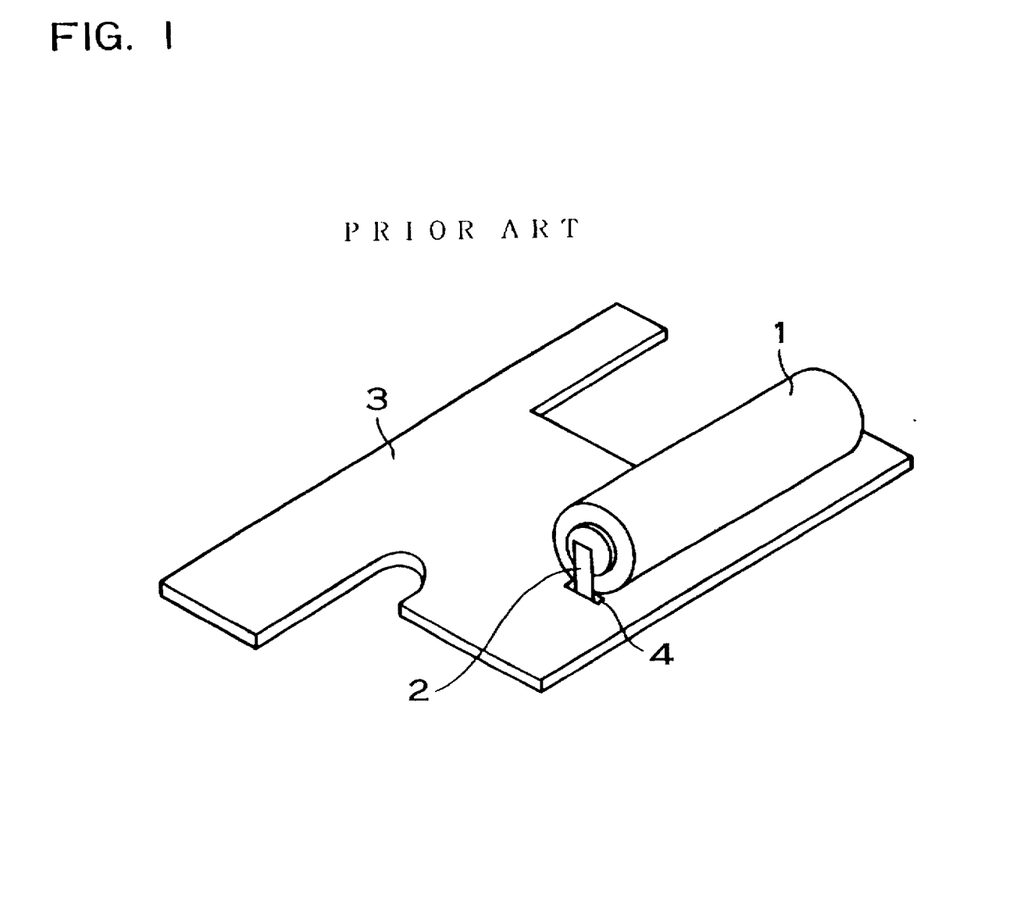
FIG. 1 is an oblique view showing an internal structure to attach a battery to a PCB in a prior art electrical apparatus.

Turning to FIG. 1, an oblique view of a battery fixed to a PCB which is housed within an electrical apparatus is shown. In this figure, 1 is the battery. Battery 1 is, for example, a nickel cadmium battery with + and − electrode terminals provided at its ends. Conducting tabs 2 are spot welded to the battery electrode terminals. Since there is no need to make the battery removable from the body of the apparatus, it is soldered directly to the PCB 3 housed within the apparatus. The conducting tabs 2 serve as attachment points for soldering to the PCB. Space is allotted on the PCB 3 for the battery 1, and slits 4 are provided through the board corresponding to the conducting tab 2 locations at both ends of the battery. The battery 1 is held on the PCB 3 by the conducting tabs 2 whichare inserted through the slits 4 in the board. The conducting tabs 2 are bent back on the reverse side of the board and soldered to the reverse side of the PCB 3. In this fashion, the battery 1 is fixed to the PCB 3 and housed within the apparatus.

The battery attachment system shown in FIG. 1 has the characteristic that the battery 1 can be easily secured within the apparatus. However, electrical contact problems due to poor solder attachment of the conducting tabs 2 to the PCB 3 can occur with this type of battery attachment. Contact failure between the conducting tabs 2 and the PCB 3 is extremely difficult to determine externally. This is because even when solder attachment appears to be made, a solid connection across the gap between the conducting tab 2 and a conducting run on the PCB may not be made. Further, failure caused by this type of contact problem is an intermittent failure with good contact at some times and bad contact at other times. This makes repair extremely difficult and also makes it difficult to determine whether or not the unit has been completely repaired.

Figure 2:
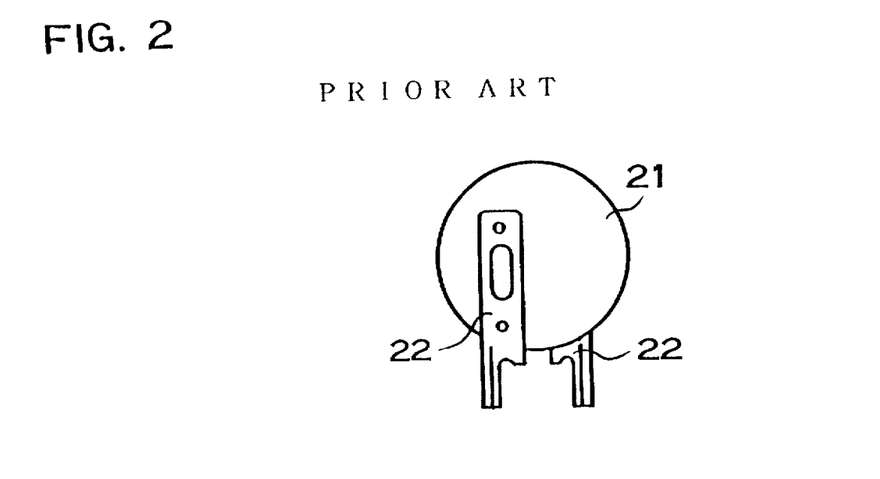
FIG. 2 is a front view of a prior art battery for PCB attachment.
Figure 3:
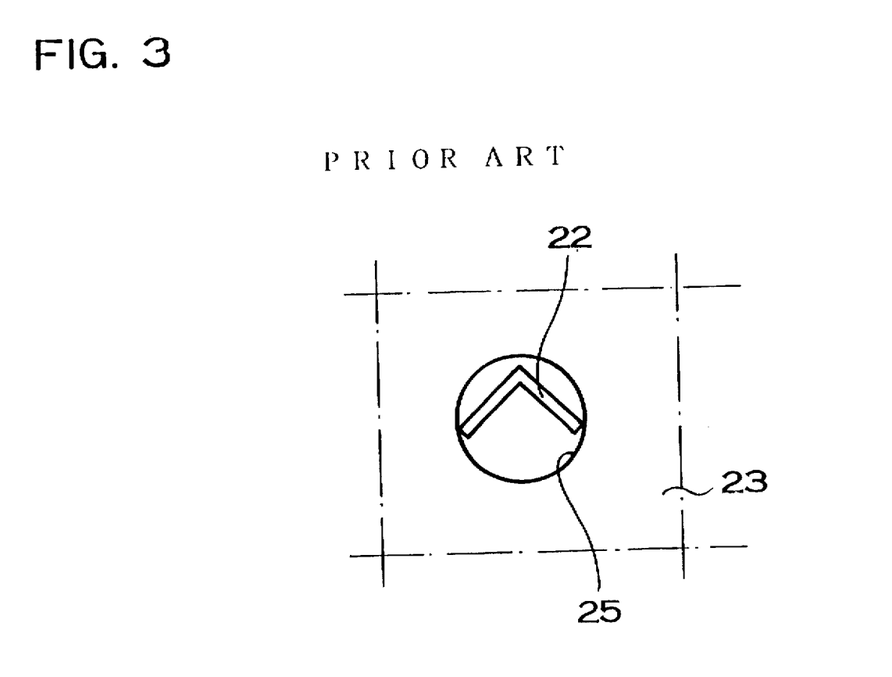
FIG. 3 is a plan view showing a conducting tab of the battery of FIG. 2 inserted in a circular hole of the PCB.

A battery attachment system wherein the conducting tabs are bent into V-shapes, inserted into circular holes in the PCB, and soldered (Japanese Non-examined Patent Publication No. 61-138457 issued Jun. 25, 1986) has been developed to prevent this contact problem. As shown in FIGS. 2 and 3, the conducting tabs described in this disclosure have a section bent into a V-shape which is inserted into a circular hole 25 in the PCB 23 and attached by soldering. In this configuration, the edges on both sides of the V-shaped conducting tab 22 are soldered in place while pushing with spring action against the inside surface of the circular hole 25. However, even with this system, contact failure between the conducting tabs 22 and the PCB 23 cannot be reduced to a rare event. Since the edges on both sides of the V-shaped conducting tab 22 push against the circular hole 25 only along straight lines, it is difficult to attach the conducting tab 22 to the PCB 23 in a sturdy manner allowing no movement. In addition, when the gap between the conducting tab 22 and the circular hole 25 in the PCB 23 widens, it is difficult to obtain close adherence of solder to a large conducting tab 22 surface area. To reliably solder attach the conducting tab to the PCB and reduce contact failure to a rare event, it is important that solder closely adhere to a large amount of conducting tab surface area, and that a sturdy attachment is made that does not allow the conducting tab to move.

It is thus the first object of the present invention to eliminate these drawbacks of prior apparatus by providing an electrical apparatus containing batteries which can reliably connect a battery to a PCB via conducting tabs in a fashion that reduces contact failure to a rare event.

A further drawback of the configuration shown in FIGS. 2 and 3 wherein the battery tabs 22 are solder attached to the PCB 23 is that the battery 21 cannot be easily removed from the PCB 23 when the electrical apparatus is discarded. In recent years demand has grown for recovery and recycling of rechargeable batteries like nickel cadmium batteries. For the preservation of the environment, rechargeable batteries that have exceeded their lifetime or are unusable for some other reason should not be discarded with other trash. As shown in FIGS. 1 through 3, a battery 1, 21 soldered to a PCB 3, 23 cannot be removed from that PCB 3, 23 without using a tool such as electronic cutting pliers to shear the conducting tabs 2, 22. For this reason, recovery of discarded batteries 1, 21 such as nickel cadmium batteries is greatly impeded.

Figure 4:
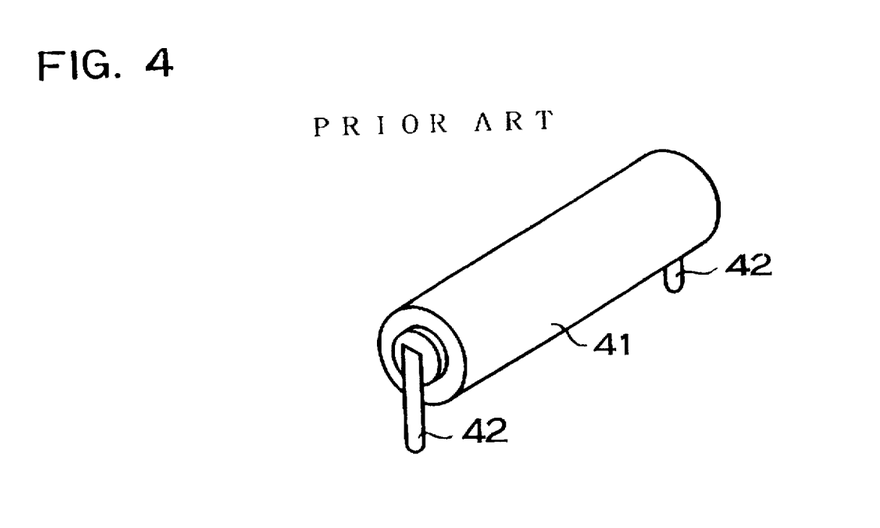
FIG. 4 is an oblique view showing a battery which is removable from the PCB according to a prior application by the present inventor.
Figure 5:
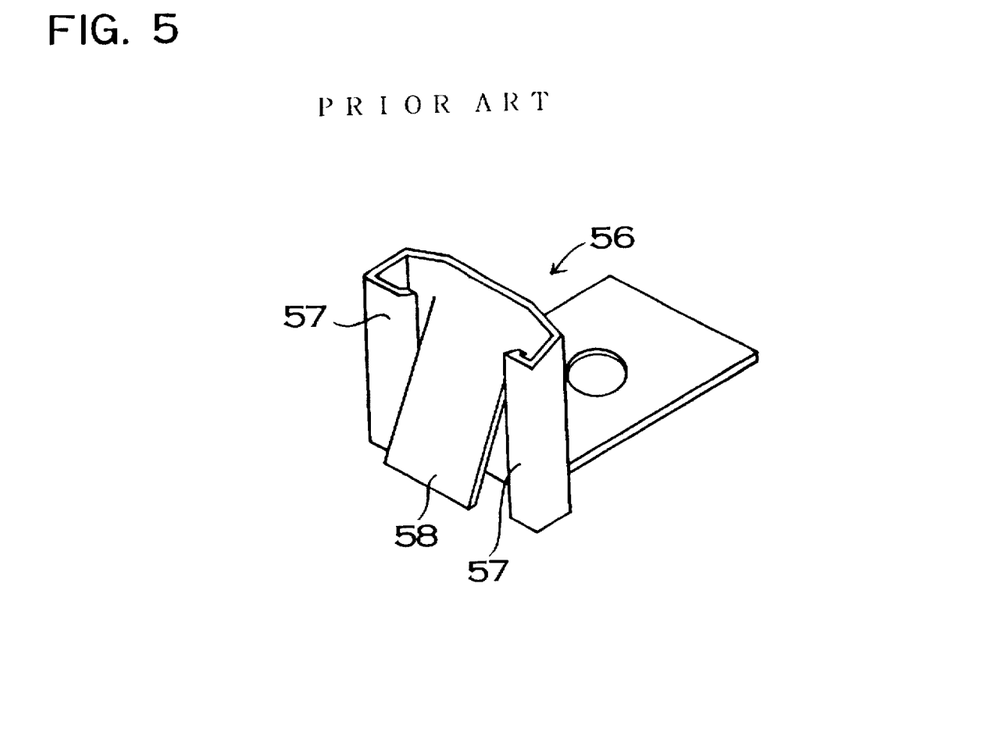
FIG. 5 is an oblique view showing a socket connector for attaching the battery of FIG. 4 to the PCB in a removable fashion.
Figure 6:
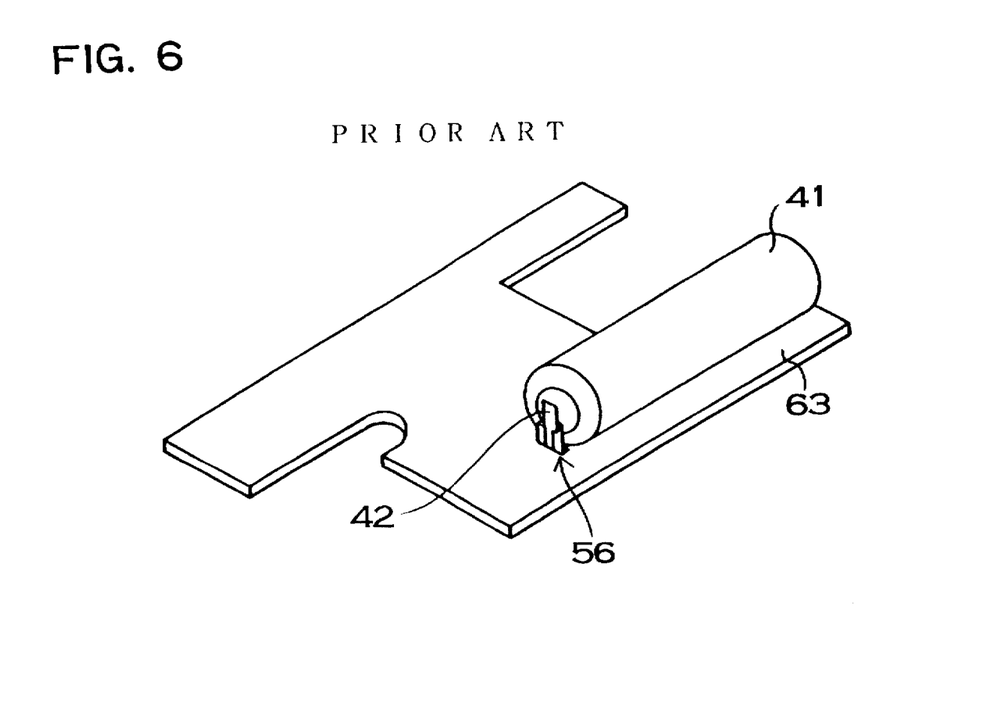
FIG. 6 is an oblique view showing the battery of FIG. 4 attached to the PCB by the socket connector of FIG. 5.

To avoid this drawback, the inventor has developed removable battery connectors (Japanese Utility Model Application HEI 5-39312, 1993 filed Jul. 19,1993) wherein a battery 41 with conducting tabs 42 spot welded to its terminals, as shown in FIG. 4, is attached to a PCB 63 in a removable fashion, as shown in FIG. 6, via a socket connector 56 with the structure shown in FIG. 5. The socket connector 56 shown in these figures has a solder section which is fixed to the PCB 63 by soldering. The connecting section of the socket connector 56 is bent to stand perpendicular to the PCB 63 and has a structure that squeezes an inserted conducting tab 42. Both sides of the connecting section are bent back forming flanges 57 that can squeeze the lateral edges of a conducting tab 42. Further, a pressure tongue 58 is provided in the connecting section which applies an elastic pressure against a conducting tab 42. This configuration of a removable battery connector has the characteristic that electrical connection is made by elastic pressure applied by the pressure tongue 58 and flanges 57 on the conducting tab 42.

However, this removable battery connector has the drawbacks that the socket connector 56 has a complex structure and it is difficult for the conducting tab 42 and the socket connector 56 to make electrical connection by surface-tosurface contact over a wide surface area. Contact over a small surface area results from the pressure tongue 58 and flanges 57 contacting the conducting tab 42 only along straight lines. Further, since the pressure tongue 58 pushes against the conducting tab 42, it is difficult for the pressure tongue 58 to flexibly push the conducting tab 42 strongly against the flanges 57 over a long period of time. Consequently, it is difficult to improve the connector's resistance to shock and vibration.

It is thus an important object of the present invention to solve these additional problems by providing an electrical apparatus containing batteries wherein batteries are connected to a PCB by a simple system in a manner having exceptional resistance to shock and vibration, and wherein the batteries can be easily removed from the PCB when the electrical apparatus is discarded.

The above and further objects and features of the invention will more fully be apparent from the following detailed description with accompanying drawings.

SUMMARY OF THE INVENTION

The electrical apparatus containing batteries of the present invention houses at least one printed circuit board (PCB). Batteries are mounted on a PCB. Sheet metal conducting tabs are connected to the battery electrodes. The conducting tabs are inserted into circular holes in the PCB and secured by soldering, or inserted in a removable fashion into sheet metal sockets soldered to the PCB.

The conducting tab of the electrical apparatus of the present invention is provided with a cylindrical insertion section for connecting the conducting tab to the PCB. The cylindrical insertion section is provided with a pressure contact section which is slit vertically with opposing sides which flexibly open outwards in the radial direction. In addition, the conducting tab pressure contact section is curved to conform to the inner walls of a circular hole in the PCB or the cylindrical connecting section of a socket connector fixed to the PCB. Specifically, this configuration provides electrical connection by surface-to-surface contact over the inner walls of a circular hole or socket connecting section.

DETAILED DESCRIPTION OF THE INVENTION

In the electrical apparatus of the present invention, a battery is either fixed to a printed circuit board (PCB) via conducting tabs or is connected to the PCB in a removable fashion via conducting tabs and socket connectors. The conducting tabs are connected to a battery by spot welding or another attachment method. The socket connectors which allow removable connection of the battery to the PCB are fixed to the PCB by a method such as solder attachment. The PCB has circular holes for connecting the conducting tabs. The conducting tabs have cylindrical insertion sections for insertion into PCB circular holes or socket connectors. When a conducting tab cylindrical insertion section is inserted into a PCB circular hole or socket connector cylindrical connecting section, the pressure contact section of the cylindrical insertion section pushes flexibly against the PCB circular hole or socket connector cylindrical connecting section for surface-to-surface contact. Consequently, the conducting tab makes electrical contact with the PCB circular hole or socket connector over a large surface area. Further, the opposing sides of the pressure contact section of the cylindrical insertion section act in a flexible manner to open outward. This flexible outward force pushes against the inner walls of the cylindrical connecting section. Therefore, this system has the feature that the conducting tab and the PCB or socket connector make electrical contact over a large surface area in an extremely stable manner with excellent resistance to shock and vibration, and furthermore, the connection is mechanically strong.

Figure 10:
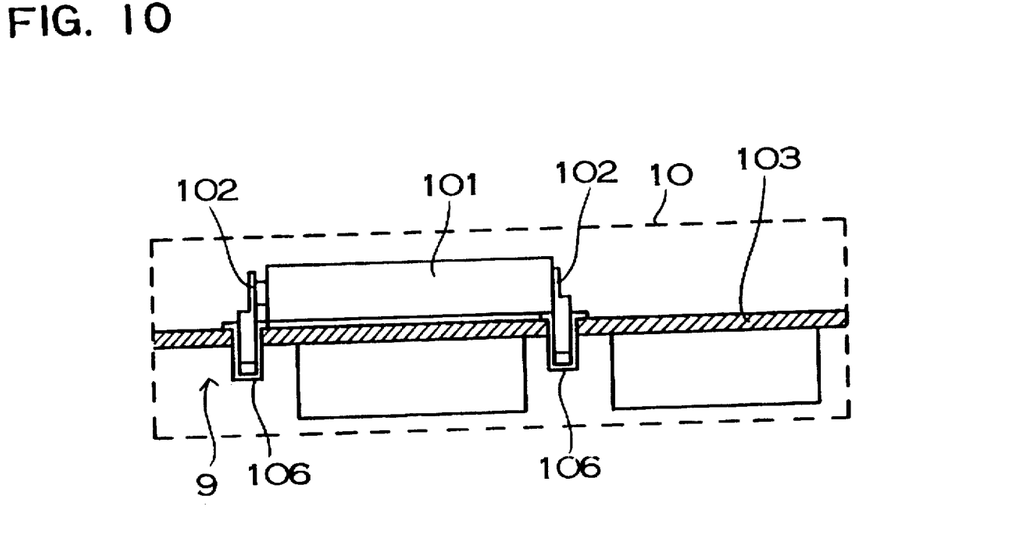
FIG. 10 is an abbreviated cross-section view of the electrical apparatus of an embodiment of the present invention.

Embodiments of the present invention are described with reference to the drawings in the following. Turning to FIG. 10, the electrical apparatus shown contains a PCB 103 within the case 10. The PCB 103 has a battery 101 attached in a removable fashion to its upper surface. The battery 101 is a rechargeable battery or a non-rechargeable battery. In the case where the electrical apparatus contains a rechargeable battery, parts which make up a 101 charging circuit for the battery are mounted on the PCB 103. Parts which constitute the load are also mounted on the PCB 103. The present invention does not specify or restrict the application of the electrical apparatus. For example, the electrical apparatus may be an electric shaver, a portable telephone, an electric toothbrush, or a micro-computer. The battery 101 attached to the PCB 103 may be a rechargeable battery such as a nickel cadmium battery, a nickel metal hydride battery, or lithium ion battery, or it may be a non-rechargeable battery such as a lithium battery. The battery shown in FIG. 10 is mounted on the PCB 103 via releasing connectors 9.

The releasing connectors 9 are made up of sheet metal socket connectors 106 secured to the PCB 103, and sheet metal conducting tabs 102 fixed to the electrodes of the battery 101. The battery 101 attaches to the PCB 103 in a removable fashion via the conducting tabs 102 and the socket connectors 106.

Figure 7:
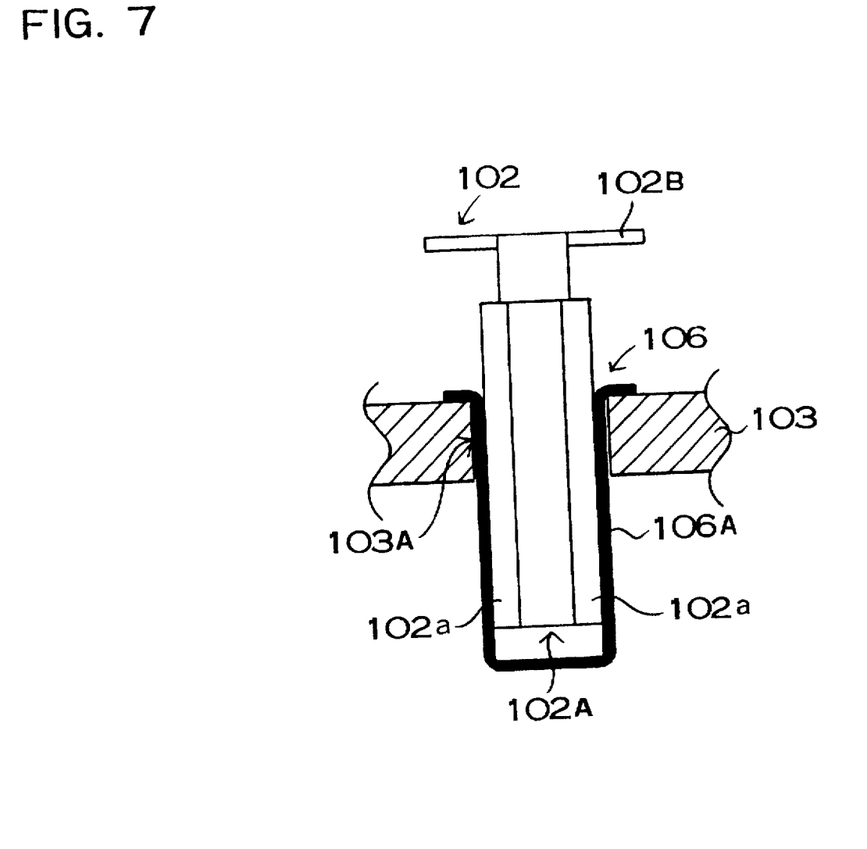
FIG. 7 is a cross-section view showing the battery and PCB connection for an embodiment of the electrical apparatus containing batteries of the present invention.
Figure 11:
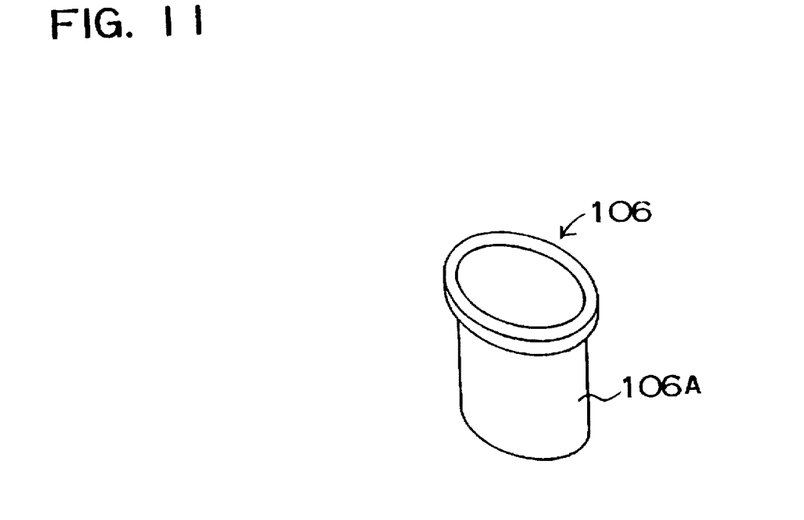
FIG. 11 is an oblique view of a socket connector housed in the electrical apparatus of an embodiment of the present invention.

As shown in FIG. 7, the socket connectors 106 have cylindrical connecting sections 106A to accept the insertion section of a conducting tab 102 in a removable fashion. The socket connectors 106 shown in FIG. 7 and FIG. 11 are metal pipes with flanges on their upper ends. These socket connectors 106 use metal pipes as their cylindrical connecting sections 106A. This form of socket connector 106 is secured to the PCB 103 by inserting the metal pipe through a circular hole 103A in the PCB 103 and soldering the flange to conducting runs on the upper surface of the PCB 103. The socket connectors 106 shown in the figures have circular cylindrical connecting sections 106A, but the cylindrical connecting sections 106A may also be any shape from elliptical to polygonal cylinders.

Figure 8:
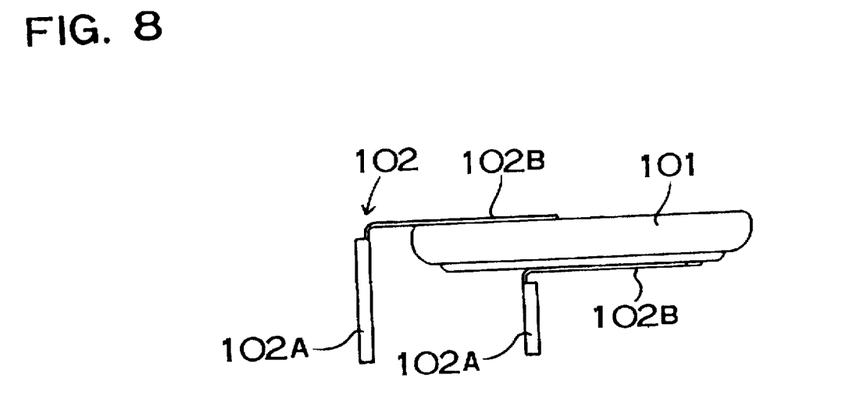
FIG. 8 is a side view showing a specific embodiment of a battery for PCB attachment in a removable fashion.
Figure 9:
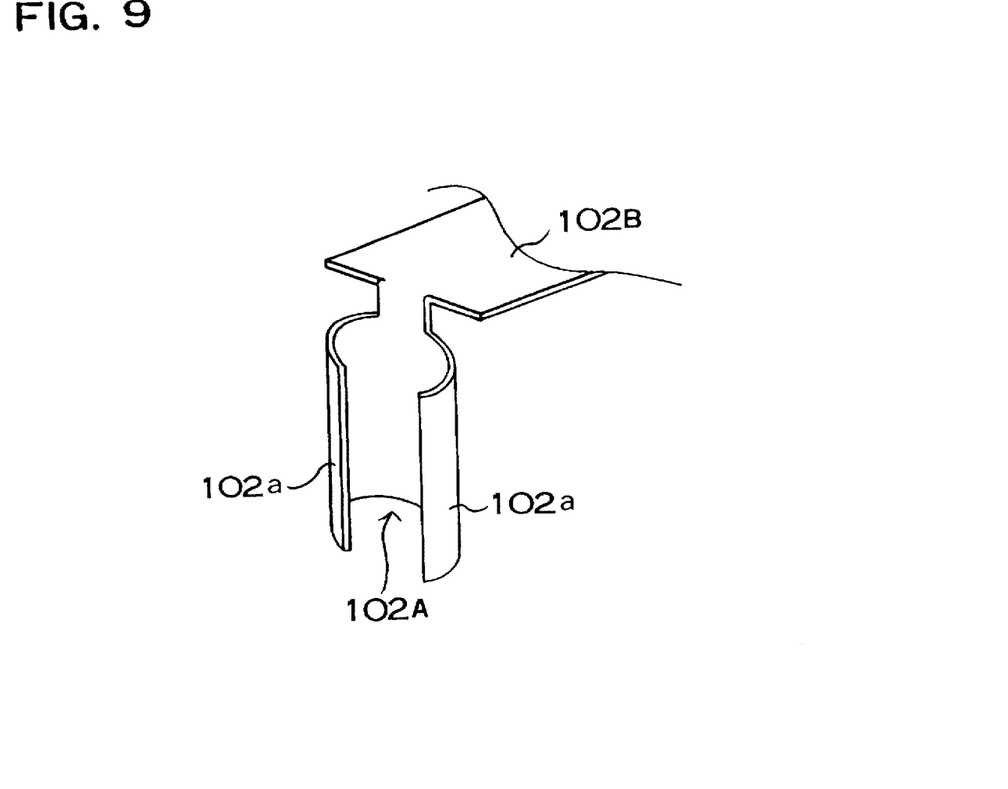
FIG. 9 is an oblique view showing a specific embodiment of a conducting tab for attaching a battery to a PCB in a removable fashion.
Figure 12:
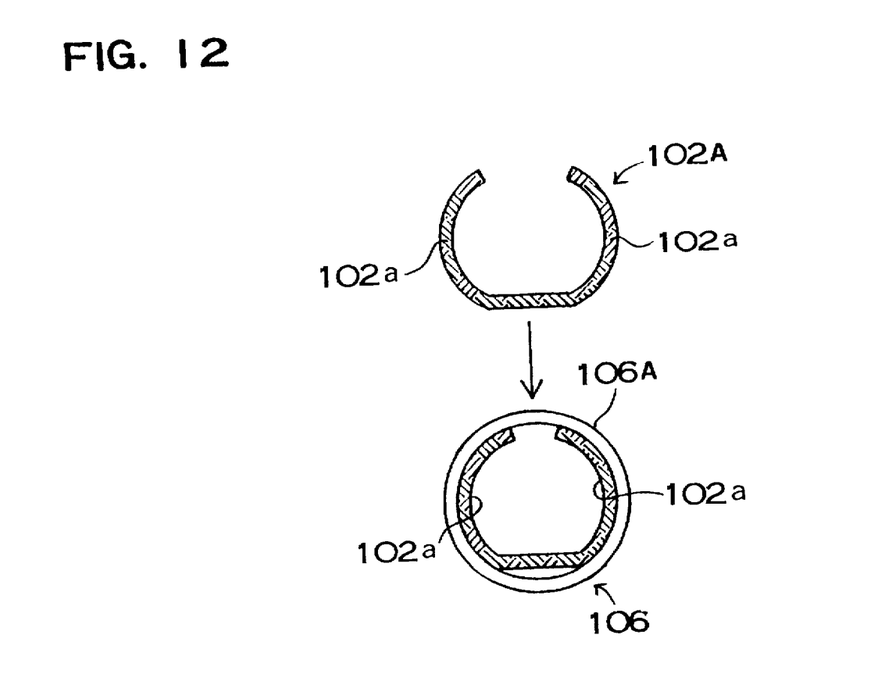
FIG. 12 is a cross-section view showing the conducting tab of FIG. 9 inserted in a socket connector.

The conducting tab 102 is formed by sheet metal pressing. The conducting tab 102 has a cylindrical insertion section 102A which inserts into the cylindrical connecting section 106A of a socket connector 106, and a welding section 102B which is spot welded to a battery electrode. As shown in FIGS. 8, 9, and 12, the insertion section 102A is slit vertically with pressure contact sections 102a provided on opposing sides. The pressure contact sections 102a open flexibly outward in the radial direction due to sheet metal elasticity. Further, as shown in FIGS. 7 and 12, the pressure contact sections 102a are formed in shapes that conform to the shape of the inner walls of the cylindrical connecting section 106A of a socket connector 106. This allows surface-to-surface electrical contact of the pressure contact sections 102a with the inner surface of the cylindrical connecting section 106A.

A conducting tab contained within the electrical apparatus of the present invention may also have a cylindrical insertion section shaped as shown in FIGS. 13 through 16. The conducting tab 132 shown in FIGS. 13A and 13B is sheet metal bent in an L-shape to form the welding section 132B and the cylindrical insertion section 132A. The cylindrical insertion section 132A is press formed to an overall shape that will fit inside a circular cylinder. As shown by the cross-section of FIG. 13B, this shape of conducting tab 132 has the feature that the cylindrical insertion section 132A can press against a larger area of the inside surface of the cylindrical connecting section 136A of the socket connector for electrical connection.

Figure 13A:
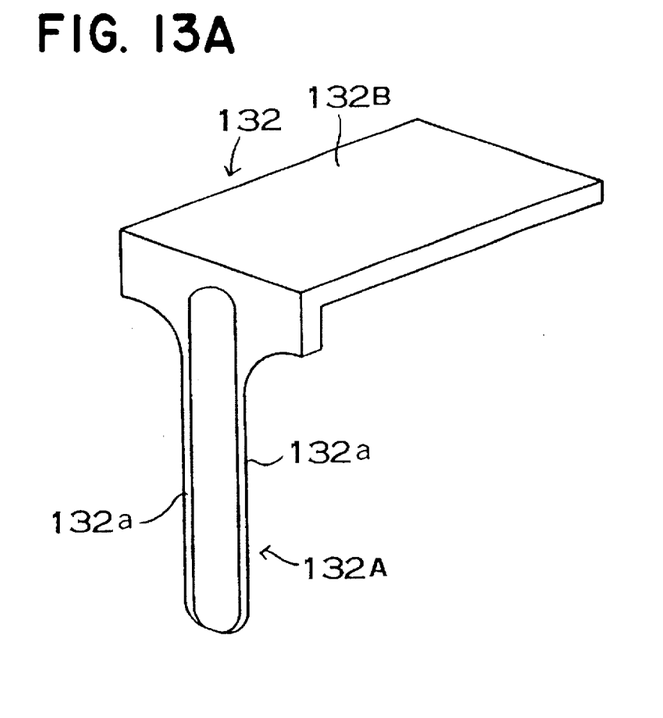
FIG. 13A is an oblique view of a conducting tab housed in the electrical apparatus of another embodiment of the present invention.
Figure 13B:
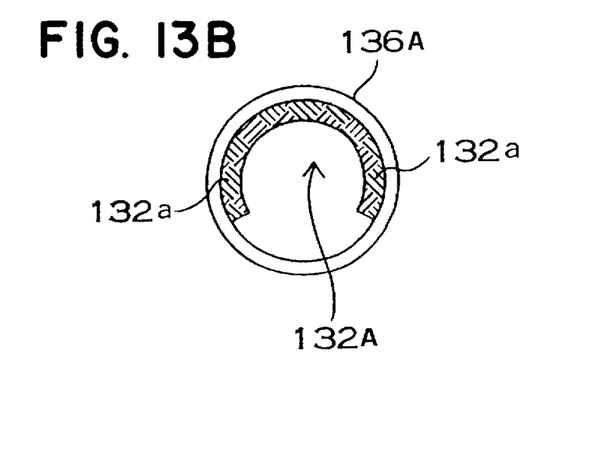
FIG. 13B is a cross-section view showing this conducting tab inserted in a socket connector.
Figure 14A:
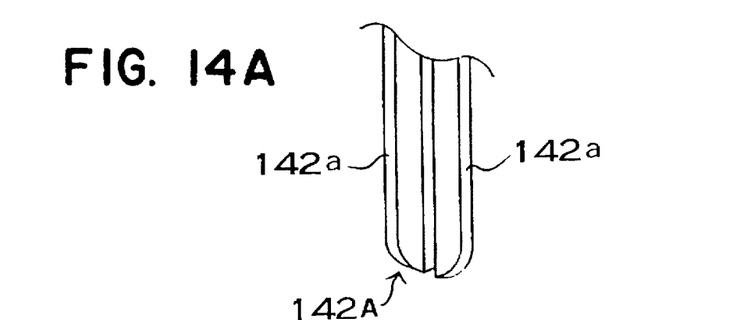
FIG. 14A is a view of a conducting tab housed in the electrical apparatus of another embodiment of the present invention.
Figure 14B:
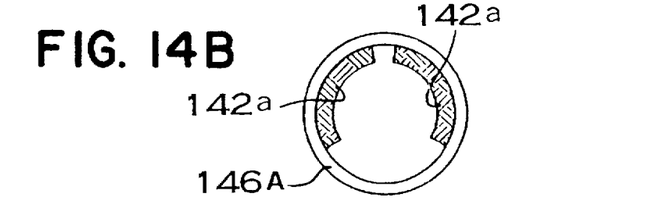
FIG. 14B is a cross-section view showing this conducting tab inserted in a socket connector.

Turning to FIG. 14A and FIG. 14B, the conducting tab cylindrical insertion section 142A shown has a shape similar to that shown in FIG. 13A and FIG. 13B with a separating slit down the middle vertically dividing it into two pieces. As shown by the cross-section of FIG. 14B, this shape of cylindrical insertion section 142A makes electrical connection with both pressure contact sections 142a pressing flexibly against the inner walls oft connecting section 146A of a socket connector.

Figure 15A:
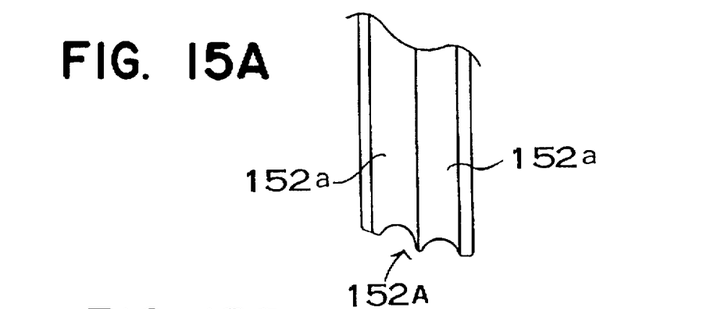
FIG. 15A is a view of a conducting tab housed in the electrical apparatus of another embodiment of the present invention.
Figure 15B:
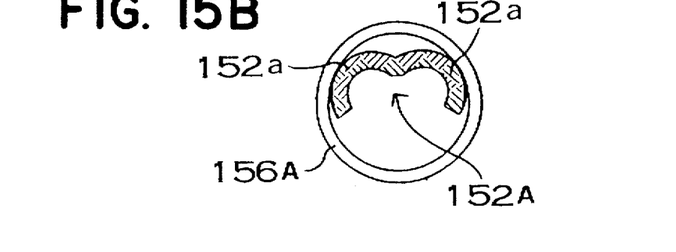
FIG. 15B is a cross-section view showing this conducting tab inserted in a socket connector.

The conducting tab cylindrical insertion section 152A shown in FIGS. 15A and 15B is provided with a pair of pressure contact sections 152a which take the form of two connected adjacent circular cylinders. This shape of cylindrical insertion section 152A has cylindrical pressure contact sections 152a with outer surface radii of curvature smaller than the inner surface radius of the cylindrical connecting section 156A. Thus the pressure contact sections 152a are curved to follow the inner surface of the cylindrical connecting section 156A. This shape of pressure contact section 152a contacts a somewhat smaller surface area of the inner wall of the cylindrical connecting section 156A than the pressure contact sections 132a and 142a shown in FIGS. 13A, 13B, 14A and 14B. However, since the contact surface area is small, larger contact force per unit area can be applied.

Figure 16A:
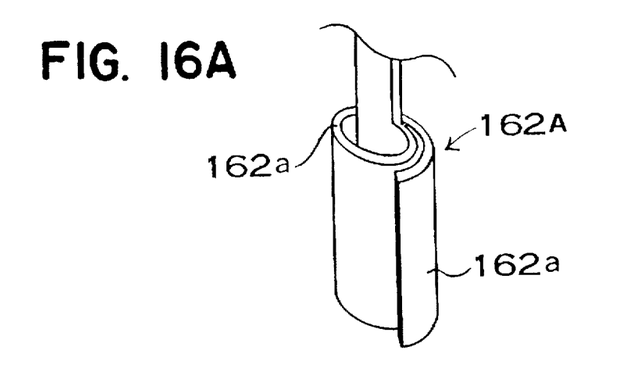
FIG. 16A is a view of a conducting tab housed in the electrical apparatus of another embodiment of the present invention.
Figure 16B:
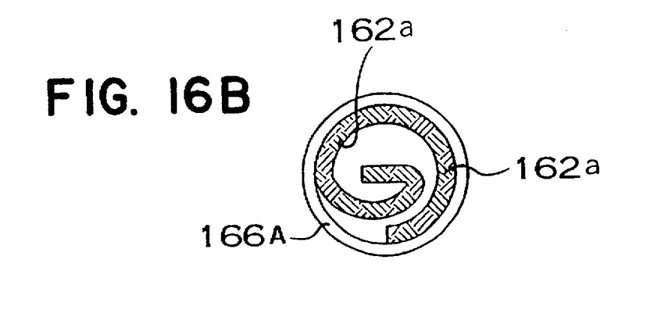
FIG. 16B is a cross-section view showing this conducting tab inserted in a socket connector.

Finally, the conducting tab shown in FIG. 16 has a cylindrical insertion section 162A which is sheet metal wound into a spiral. This shape of cylindrical insertion section 162A is provided with a spiral pressure contact section 162a which is cut off at the beginning and end of the spiral winding. As shown by the cross-section of FIG. 16B, this shape of cylindrical insertion section 162A makes electrical connection with the pressure contact section 162a pressing flexibly against the inner walls of the cylindrical connecting section 166A.

The conducting tabs described above are sheet metal bent in an L-shape to form the welding section and the cylindrical insertion section. This form of conducting tab has the feature that it can be inexpensively manufactured in quantity from a single piece of sheet metal. However, the conducting tab to attach the battery to the PCB in the electrical apparatus of the present invention is not restricted to the structures described above. For example, although not illustrated, the welding section and the cylindrical insertion section may be fabricated separately and joined by welding.

The releasing connectors with structures described above attach a battery to a PCB in the following manner. ~Conducting tabs 102 are spot welded to the + and − electrodes of the battery 101. The conducting tabs 102 may be connected to the electrodes by methods other than spot welding such as soldering. ~The cylindrical connecting sections 106A of the socket connectors 106 are inserted into circular holes 103A in the PCB 103. The flanges of the socket connectors 106 are soldered to conducting runs on the PCB 103 to secure the socket connectors 106 to the PCB 103. The circular holes 103A are opened through the PCB 103 at locations corresponding to the insertion of the conducting tabs 102 of the battery 101. ~The cylindrical insertion sections 102A of the conducting tabs 102 spot welded to the battery 101 are inserted into the socket connectors 106 secured to the PCB 103. ~With the cylindrical insertion sections 102A of the conducting tabs 102 inserted in the cylindrical connecting sections 106A of the socket connectors 106, the pressure contact sections 102a press flexibly against the inner surfaces of the cylindrical connecting sections 106A. In this configuration, the conducting tabs 102 are connected with the socket connectors 106 securing the battery 101 to the PCB 103 as well as making electrical connection between the battery 101 and the conducting runs on the PCB 103.

This structure of an electrical apparatus has the feature that a battery can be mounted on a PCB in a removable fashion by a simple system with excellent resistance to shock and vibration. In particular, an electrical apparatus with a battery mounted on a PCB via conducting tabs and socket connectors allows easy removal of an unusable battery for recycling when the apparatus is discarded. This system has the feature that the environment can be protected from hazardous materials in the battery, and materials that can effectively be reused can be recovered and recycled.

The key to good battery-to-PCB attachment in the electrical apparatus described above is provision of a cylindrical insertion section on the conducting tab. Formation of the cylindrical shape makes the insertion section difficult to bend or fold compared to a flat sheet metal shape which has insufficient strength. In addition, the insertion section's cylindrical shape makes surface contact with, and pushes against the inner surface of the socket connector or circular hole. The cylindrical insertion section of the conducting tab is provided with pressure contact sections which open flexibly outward in the radial direction. Surface-to-surface pressure from the pressure contact sections against the socket connector cylindrical connecting section results in strong battery-to-PCB attachment with excellent shock and vibration resistance. Furthermore, this strong battery-to-PCB attachment has the effect of minimizing electrical contact problems.

Figure 17:
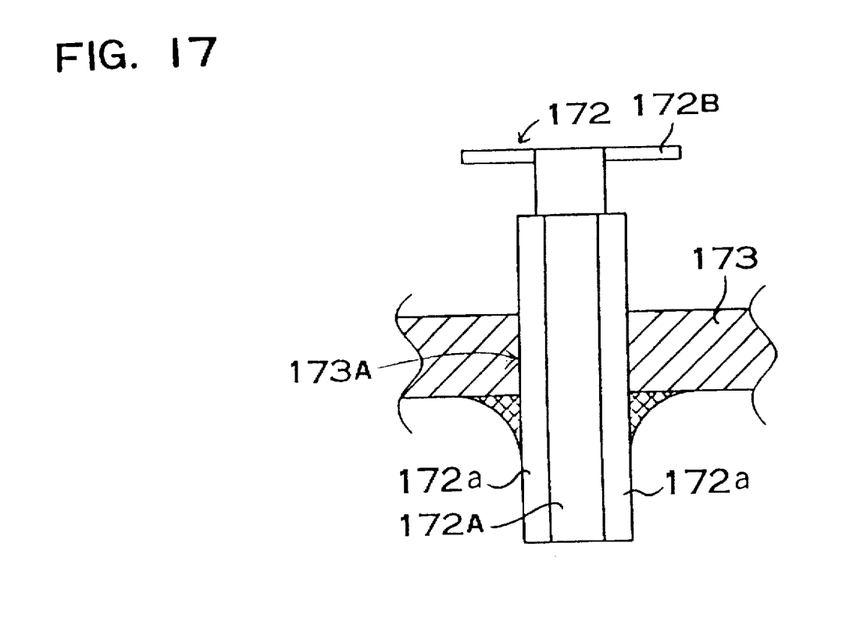
FIG. 17 is a cross-section view showing a conducting tab soldered into a PCB in a non-removable fashion.

The embodiments described above attach a battery 101 to a PCB 103 by inserting conducting tabs 102 in socket connectors 106. In the electrical apparatus of the present invention, the battery can also be permanently secured to the PCB by soldering the conducting tabs to the PCB. Batteries, such as nickel metal hydride batteries or nonrechargeable batteries, which can be disposed without causing a hazard, are used in electrical apparatus with the battery soldered directly to the PCB. Turning to FIG. 17, an electrical apparatus with the battery soldered directly to the PCB is shown. As shown in FIG. 17, the conducting tab 172 is inserted into a circular hole 173A provided in the PCB 173 and is secured by soldering the conducting tab 172 cylindrical insertion section 172A to a conducting run on the PCB 173.

The same conducting tab structure described previously for attachment of a battery 101 to a PCB 103 using socket connectors 106 can be used as conducting tabs 172 inserted into circular holes 173A and soldered to the PCB 173. Consequently, the electrical apparatus of the present invention can use the same conducting tab structure for soldering the battery directly to the PCB or for removable attachment of the battery to the PCB via conducting tabs and socket connectors.

In this or electrical apparatus structure the pressure contact section of the conducting tab cylindrical insertion section exerts an elastic outward expanding force and is soldered directly into a PCB circular hole to secure it to the PCB. The elastic outward expanding pressure contact section can also be squeezed together in the radial direction. Therefore, the pressure contact section can fit into both narrow holes as well as somewhat wide holes provided in the PCB and make a tight fitting insertion. Since the pressure contact section expands radially to press against the inner surface of larger circular holes, it can be inserted and soldered into somewhat different size holes. For example, this allows the conducting tab cylindrical insertion section to be inserted and soldered into a circular hole intended to accept a socket connector. Consequently, this structure of electrical apparatus allows the same conducting tab to be used to attach the battery to the PCB in a removable fashion as well as to secure the battery to the PCB in a permanent fashion.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims or equivalents of such meets and bounds thereof are therefore intended to be embraced by the claims.

What is claimed is:

1. An electrical apparatus for attaching a battery to a printed circuit board in a removable fashion, comprising:
   a sheet metal socket connector which has a cylindrical connecting section to connect in a removable fashion a sheet metal conducting tab fixed to a battery electrode, and which itself is secured to the printed circuit board to attach the battery to the printed circuit board in a removable fashion;
   a conducting tab provided with a cylindrical insertion section which inserts into the cylindrical connecting section of the socket connector and has a pressure contact section which is slit vertically with opposing sides that open flexibly outward in the radial direction, and wherein the pressure contact section is curved to almost conform to the inner surface of the cylindrical connecting section to make surface-to-surface electrical contact with an inner surface of the cylindrical connecting section;
   wherein the cylindrical connecting section of the socket connector is formed as a metal pipe; and
   wherein the socket connector is secured by solder to a conducting run on the upper surface of the printed circuit board.

2. An electrical apparatus as recited in claim 1 wherein the cylindrical connecting section of the socket connector has the shape of a cylinder with a true circular cross-section.

3. An electrical apparatus as recited in claim 1 wherein the conducting tab has pressure contact sections in opposing locations which open flexibly outward in the radial direction due to the elasticity of the sheet metal.

4. An electrical apparatus as recited in claim 1 wherein the conducting tab cylindrical insertion section is shaped as two connected adjacent circular cylinders providing a pair of pressure contact sections, and the outer surfaces of the pressure contact sections have radii of curvature smaller than the cylindrical connecting section radius such that the shape of the cylindrical insertion section is curved to conform to the inner surface of the cylindrical connecting section.

5. An electrical apparatus as recited in claim 1 wherein the conducting tab has a cylindrical insertion section formed by winding sheet metal into a spiral, and the opposing sides of the pressure contact section are provided in opposing locations by cutting the cylindrical insertion section at the beginning and end of winding.

6. An electrical apparatus as recited in claim 1 wherein said socket connector includes a flange provided at a top end of said cylindrical connecting section.

7. An electrical apparatus as recited in claim 6 wherein said solder which secures said socket connector to the conducting run comprises solder securing said flange to the conducting run.

8. An electrical apparatus for attaching a battery to a printed circuit board in a removable fashion, comprising:
   a sheet metal socket connector which has a cylindrical connecting section to connect in a removable fashion a sheet metal conducting tab fixed to a battery electrode, and which itself is secured to the printed circuit board to attach the battery to the printed circuit board in a removable fashion;

a conducting tab provided with a cylindrical insertion section which inserts into the cylindrical connecting section of the socket connector and has a pressure contact section which is slit vertically with opposing sides that open flexibly outward in the radial direction and wherein the pressure contact section is curved to almost conform to the inner surface of the cylindrical connecting section to make surface-to-surface electrical contact with an inner surface of the cylindrical connecting section; and wherein the conducting tab has both the cylindrical insertion section which inserts into the cylindrical connecting section of the socket connector, and a welding section which is spot welded to the battery electrode.

9. An electrical apparatus for attaching a batter to a printed circuit board in a removable fashion, comprising:

a sheet metal socket connector which has a cylindrical connecting section to connect in a removable fashion a sheet metal conducting tab fixed to a battery electrode, and which itself is secured to the printed circuit board to attach the battery to the printed circuit board in a removable fashion;

a conducting tab provided with a cylindrical insertion section which inserts into the cylindrical connecting section of the socket connector and has a pressure contact section which is slit vertically with opposing sides that open flexibly outward in the radial direction and wherein the pressure contact section is curved to almost conform to the inner surface of the cylindrical connecting section to make surface-to-surface electrical contact with an inner surface of the cylindrical connecting section; and wherein the conducting tab is bent in an L-shape providing a welding section and the cylindrical insertion section, and the cylindrical insertion section is formed in an overall shape to conform to the circular cylindrical connecting section by press forming.

10. An electrical apparatus for attaching a battery to a printed circuit board in a removable fashion, comprising:

a sheet metal socket connector which has a cylindrical connecting section to connect in a removable fashion a sheet metal conducting tab fixed to a battery electrode, and which itself is secured to the printed circuit board to attach the battery to the printed circuit board in a removable fashion:

a conducting tab provided with a cylindrical insertion section which inserts into the cylindrical connecting section of the socket connector and has a pressure contact section which is slit vertically with opposing sides that open flexibly outward in the radial direction, and wherein the pressure contact section is curved to almost conform to the inner surface of the cylindrical connecting section to make surface-to-surface electrical contact with an inner surface of the cylindrical connecting section; and wherein the conducting tab cylindrical insertion section is split vertically down the middle into two parts, and both sides of the pressure contact section press flexibly against the inner surface of the socket connector cylindrical connecting section.

11. An electrical apparatus with a battery secured to a printed circuit board comprising:

a printed circuit board with circular holes for receiving a sheet metal conducting tab fixed to a battery electrode; and a conducting tab provided with a cylindrical insertion section which inserts into one of the circular holes in the printed circuit board and has a pressure contact section which is slit vertically with opposing sides that open flexibly outward in the radial direction and wherein the pressure contact section is curved to almost conform to the inner surface of said one of the circular holes of the printed circuit board to make surface-to-surface electrical contact with the inner surface of said one of the circular holes; and wherein the conducting tab has both the cylindrical insertion section which inserts into said one of the circular holes of the printed circuit board, and a welding section which is spot welded to the battery electrode.

12. An electrical apparatus as recited in claim 11 wherein the conducting tab has pressure contact sections in opposing locations which open flexibly outward in the radial direction due to the elasticity of the sheet metal.

13. An electrical apparatus as recited in claim 11 wherein the conducting tab cylindrical insertion section is shaped as two connected adjacent circular cylinders providing a pair of pressure contact sections, and the outer surface of the pressure contact sections have radii of curvature smaller than the radius of said one of the circular holes such that the shape of the cylindrical insertion section is curved to conform to the inner surface of said one of the circular holes of the printed circuit board.

14. An electrical apparatus as recited in claim 11 wherein the cylindrical insertion section of the conducting tab is formed by winding sheet metal into a spiral, and pressure contact sections are provided in opposing locations by cutting the cylindrical insertion section at the beginning and end of winding.

15. An electrical apparatus with a battery secured to a printed circuit board comprising:

a printed circuit board with circular holes for receiving a sheet metal conducting tab fixed to a battery electrode; and a conducting tab provided with a cylindrical insertion section which inserts into one of the circular holes in the printed circuit board and has a pressure contact section which is slit vertically with opposing sides that open flexibly outward in the radial direction, and wherein the pressure contact section is curved to almost conform to the inner surface of said one of the circular holes of the printed circuit board to make surface-to-surface electrical contact with the inner surface of said one of the circular holes; and wherein the conducting tab is bent in an L-shape providing a welding section and the cylindrical insertion section, and the cylindrical insertion section is formed in an overall shape to conform to a circular hole of the printed circuit board by press forming.

16. An electrical apparatus with a battery secured to a printed circuit board, comprising:

a printed circuit board with circular holes for receiving a sheet metal conducting tab fixed to a battery electrode: and a conducting tab provided with a cylindrical insertion section which inserts into one of the circular holes in the printed circuit board and has a pressure contact section which is slit vertically with opposing sides that open flexibly outward in the radial direction, and wherein the pressure contact section is curved to almost conform to the inner surface of said one of the circular holes of the printed circuit board to make surface-to-surface electrical contact with the inner surface of said one of the circular holes; and wherein the conducting tab cylindrical insertion section is split vertically down the middle into two parts, and both sides of the pressure contact section press flexibly against an inner surface of said one of the circular holes of the printed circuit board.

* * * * *